US005117233A

United States Patent [19]

Hamos et al.

[11] Patent Number: 5,117,233

[45] Date of Patent: May 26, 1992

[54] SPA AND SWIMMING POOL REMOTE CONTROL SYSTEMS

[75] Inventors: Robert E. Hamos, Simi Valley; William F. Raleigh, Santa Clarita, both of Calif.

[73] Assignee: Teledyne Industries, Inc., Los Angeles, Calif.

[21] Appl. No.: 599,711

[22] Filed: Oct. 18, 1990

[51] Int. Cl.[5] .................... H61H 33/00; G06F 15/46; H03G 3/20

[52] U.S. Cl. .................................. 340/825.69; 4/496; 4/541.1; 340/825.72

[58] Field of Search .................. 4/542, 541, 540, 492, 4/493, 494, 504, 542; 341/176; 340/825.69, 825.72; 455/603

[56] References Cited

U.S. PATENT DOCUMENTS

| | | | |
|---|---|---|---|
| 4,315,248 | 2/1982 | Ward | 340/825.72 |
| 4,404,697 | 9/1983 | Hatcher . | |
| 4,424,438 | 1/1984 | Antelman et al. | 4/504 |
| 4,712,104 | 12/1987 | Kobayashi | 340/825.69 |
| 4,742,456 | 5/1988 | Kamena | 4/542 X |
| 4,780,917 | 11/1988 | Hancock | 4/542 |

OTHER PUBLICATIONS

CP-2000 Pool/Spa Control System, by Compool Corporation (1989).

Comtrol Complete Pool and Spa Control, by Compool Corporation (1989).

LX-80 Commercial Pool/Spa Control System, by Compool Corporation (1989).

Swim Master Pool/Spa Control System, by Compool Corporation (1989).

Time Master, by Compool Corporation (1982).

RC1000 Series Radio Remote Control System, by Intermatic Incorporated (1988).

Radio Controls for Spas & Pools, by Intermatic Incorporated (1988).

Autospa, by Chardonnay Corporation (1986).

Pulsar Control Corporation (1989).

*Primary Examiner*—Daniel M. Yasich

*Attorney, Agent, or Firm*—Benoit Law Corporation

[57] ABSTRACT

Methods and apparatus for controlling equipment for operating a spa, provide electrical controls for controlling such equipment, a manual stationary control for manual user operation of these electrical controls, and a manual remote control including a hand-held wireless remote control unit for manual user operation, at least from inside the spa, of the electrical controls operable by the manual stationary control. The manual stationary control is maintained activated for continued manual user operation of the equipment through the electrical controls manually from a control location while the manual remote control remains activated for manual user operation of the equipment through the electrical controls interchangeably with the manual stationary control from the control location and with the hand-held wireless remote control unit at least from inside the spa. Visual indicators are preferably provided for indicating to the user various conditions of the electrical controls and equipment as selected from time to time interchangeably with the remote control unit and with the manual stationary control.

40 Claims, 1 Drawing Sheet

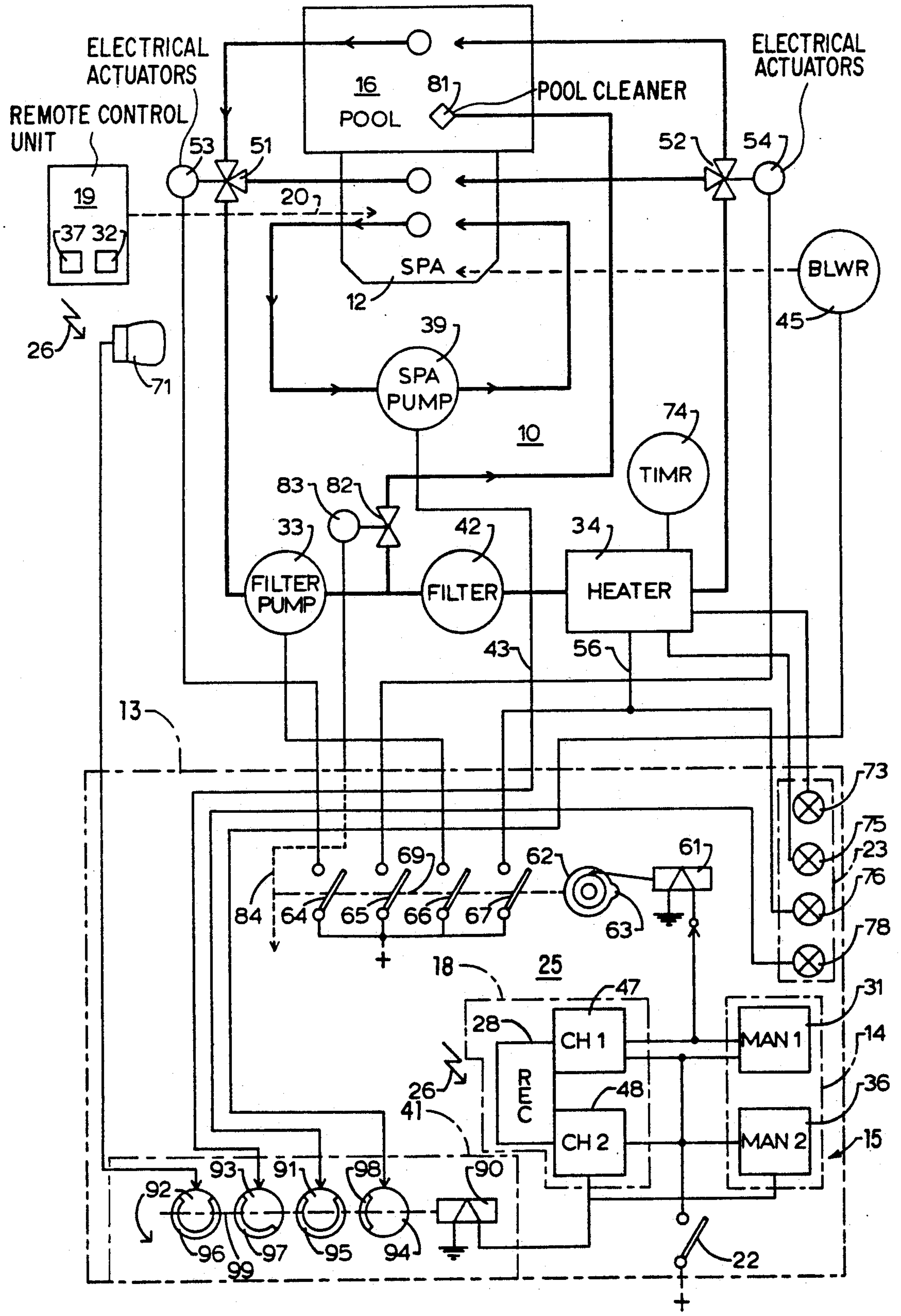
ELECTRICAL ACTUATORS
REMOTE CONTROL UNIT
19
37
32
53
51
20
16
POOL
81
POOL CLEANER
ELECTRICAL ACTUATORS
52
54
SPA
12
BLWR
45
26
71
39
SPA PUMP
10
74
TIMR
83
82
33
FILTER PUMP
42
FILTER
34
HEATER
43
56
13
73
75
23
76
78
69
62
61
84
64
65
66
67
63
+
18
25
47
CH 1
MAN 1
31
28
REC
14
36
26
41
48
CH 2
MAN 2
15
92
93
91
98
90
96
99
97
95
94
22
+

SPA AND SWIMMING POOL REMOTE CONTROL SYSTEMS

BACKGROUND OF THE INVENTION

1. Field of the Invention

The subject invention relates to spa systems and to combined spa and swimming pool systems and, more specifically, to spa and swimming pool remote and stationary control systems.

2. Information Disclosure Statement

The following disclosure statement is made pursuant to the duty of disclosure imposed by law and formulated in 37 CFR 1.56(a). No representation is hereby made that information thus disclosed in fact constitutes prior art, inasmuch as 37 CFR 1.56(a) relies on a materiality concept which depends on uncertain and inevitably subjective elements of substantial likelihood and reasonableness and inasmuch as a growing attitude appears to require citation of material which might lead to a discovery of a pertinent material though not necessarily being of itself pertinent. Also, the following comments contain conclusions and observations which have only been drawn or become apparent after conception of the subject invention or which contrast the subject invention or its merits against the background of developments which may be subsequent in time or priority.

Pool/spa control systems are shown in brochures by COMPOOL CORPORATION, of Mountain View, California, designated CP-2000, COMTROL, LX-80, SWIM MASTER, and TIME MASTER, dated 1982. These are highly sophisticated computerized control systems that offer three remote controls that can be used individually or in conjunction with each other. A single remote offers fingertip control from the spa or patio, and two remotes can be used for added convenience, one in the home and the other at the spa.

U.S. Pat. No. 4,404,697, by Frank L. Hatcher, issued Sept. 20, 1983 to Intermatic Incorporated, discloses a remote control system for spas, further illustrated in Intermatic's brochures entitled RC1000 Series Radio Remote Control System, and Radio Controls for Spas & Pools, dated 1988.

Another remote valve, light and spa control is apparent from a brochure entitled AUTOSPA, by Chardonnay Corporation, of Van Nuys, California.

While some of these remote controls offer a manual override, such as at the main control panel, the convenience and advantages of a truly interchangeable stationary control and portable remote control is missing.

This may now appear as somewhat surprising in retrospect, since garage door and gate operator radio controls traditionally have had a stationary garage door or gate control button near the rear of side entry of the garage or at the house, in addition to the portable wireless control unit typically maintained in the automobile. Reference may in this respect be had to the literature of Pulsar Control Corporation, of Hendersonville, Tennessee.

A similar situation has existed for years with television sets, where there is usually a stationary on/off, volume and channel control at the set, in addition to the corresponding remote control across the room or at a convenient viewer location.

Whatever may now appear in retrospect, the fact is that such remote control systems in other fields have not heretofore led to meeting the longstanding needs herein mentioned for spa and pool systems and met by the methods and apparatus hereinafter disclosed.

SUMMARY OF THE INVENTION

It is an object of this invention to provide spa or spa and swimming pool control systems that can interchangeably be operated from a portable remote control and from a stationary control without the need for actuation of an override switch before either control can take over from the other.

It is also an object of this invention to provide the user of a remote and stationary spa or spa and swimming pool control combination with visible indicators informative of various conditions of the control.

From one aspect thereof, the invention resides in methods and apparatus for controlling equipment for operating a spa, with or without swimming pool, providing or having electrical controls for controlling such equipment, providing or having a manual stationary control for manual user operation of these electrical controls, such manual stationary control positioned at a control location beyond manual reach from the spa, and providing or having a manual remote control including a hand-held wireless remote control unit for manual user operation, at least from inside the spa, of the electrical controls operable by the manual stationary control. This aspect of the invention also comprises the steps of, or means for, activating the manual stationary control for manual user operation of the equipment through the electrical controls manually from the control location, activating the manual remote control for manual user operation of the equipment through the electrical controls with the hand-held wireless remote control unit at least from inside the spa, and maintaining the manual stationary control activated for continued manual user operation of the equipment through the electrical controls manually from the control location while the manual remote control remains activated for manual user operation of the equipment through the electrical controls interchangeably with the manual stationary control from the control location and with the hand-held wireless remote control unit at least from inside the spa.

From a second aspect thereof the invention resides in methods and apparatus for controlling equipment for operating a spa, with or without swimming pool, providing or having electrical controls for controlling such equipment, providing or having a manual stationary control for manual user operation of these electrical controls, such manual stationary control positioned at a control location beyond manual reach from the spa, providing or having a manual remote control including a hand-held wireless remote control unit for manual user operation, at least from inside the spa, of the electrical controls operable by the manual stationary control. This aspect of the invention also comprises the steps of, or means for, activating the manual stationary control for manual user operation of the equipment through the electrical controls manually from the control location, activating the manual remote control for manual user operation of the equipment through the electrical controls with the hand-held wireless remote control unit at least from inside the spa. This aspect of the invention further provides or includes visual indicators for indicating to the user various conditions of the electrical controls and equipment as selected from time to time interchangeably with said remote control unit and with said manual stationary control.

BRIEF DESCRIPTION OF THE DRAWING

The subject invention and its various aspects and objects will become more readily apparent from the following detailed description of preferred embodiments thereof, illustrated by way of example in the accompanying drawing which shows a swimming pool and spa installation with interchangeably operable remote and stationary controls according to a preferred embodiment of the invention, and with visual indicators according to an embodiment of the invention.

DESCRIPTION OF PREFERRED EMBODIMENTS

The drawing from a first aspect thereof illustrates methods and apparatus for controlling equipment 10 for operating a spa 12. These methods and apparatus provide or include electrical controls 13 for controlling the equipment 10, and a manual stationary control 14 for manual user operation of these electrical controls. Such manual stationary control is positioned at a control location 15 beyond manual reach from the spa 12. While these stationary controls may be, and preferably are, situated at a convenient location, they are positioned beyond manual or bodily reach from the spa 12 and from the swimming pool 16, if present.

The disclosed methods and apparatus also provide a manual remote control 18 including a hand-held wireless remote control unit 19 for manual user operation of the electrical controls 13 operable also by the manually stationary control 14. The remote control 18 may be operable with the remote control unit 19 from a relatively large area in and around the spa and pool 12 and 16. However, as indicated by a dotted line 20, the remote control unit 19 serves manual user operation of the electric controls 13 at least from inside the spa 12. By this, it is not necessarily meant that the remote control unit has to be in the water. Rather, "inside the spa" means that the user is inside the water when he or she actuates the control unit 19 from inside the spa.

The illustrated preferred embodiment of the invention activates the manual stationary control 14 for manual user operation of the equipment 10 through the electrical controls 13 manually from the control location 15, and also activates the manual remote control 18 for manual user operation of the equipment 10 through the electrical controls 13 with the hand-held wireless remote control unit 19 at least from inside the spa 12.

The currently discussed aspect of the invention maintains the manual stationary control 14 activated for continued manual user operation of the equipment 10 through the electrical controls 13 manually from the control location 15 while the manual remote control 18 remains activated for manual user operation of the equipment 10 through the electrical controls 13 interchangeably with the manual stationary control 14 from that control location 15 and with the hand-held wireless remote control unit 19 at least from inside the spa 12. In the drawing, this is simply accomplished by using one main switch 22 for energizing the manual stationary control 14 and the remote control 18 at once and for maintaining these controls 14 and 18 energized until that switch 22 is reopened. More sophisticated means may, of course, be used to accomplish such claimed purpose.

The remote control unit 19 may be a transmitter or a transponder. By way of example, the remote control unit may have its own power supply in the form of a battery. In that case, the manual stationary control 14 is maintained activated while that battery also activates the remote control unit 19.

The illustrated embodiment of the invention provides visual indicators 23 for indicating to the user various conditions of the electrical controls 13 and equipment 10 as selected from time to time interchangeably with the remote control unit 19 and with the manual stationary control 14. Preferably, the visual indicators 23 are so dimensioned and positioned as to be visible from areas convenient to the user, such as from the spa 12 or from the house or residence near the spa or swimming pool and spa area. By way of example, the visual indicators 23 are positioned at the control location 15.

Preferably, there is a control center 25 at the control location 15 incorporating the manual stationary control 14, the visual indicators 23 and part of the electrical controls 13 in that control center.

Wireless control signals 26 are emitted with the hand-held wireless remote control unit for operation of the electric controls 13. The manual remote control 18 has a wireless receiver 28 for receiving the wireless control signals 26. The electrical controls 13 are activated with these received wireless control signals, while the manual stationary control 14 remains interchangeably activated according to the currently discussed aspect of the invention. The wireless receiver 28 preferably is positioned at the control location 15 or control center 25.

The preferred embodiment of the currently discussed aspect of the invention provides the manual stationary control 14 and the manual remote control 18 including the hand-held wireless remote control unit 19 with corresponding first actuators 31 and 32 for switching a filter pump 33 and heater 34 for the spa on and off through the electrical controls 13, and with corresponding second actuators 36 and 37 for operating the filter pump at increased speed as a spa pump through the electrical controls 13. Installations wherein a pool filter pump is used also as a spa pump are well known as such.

However, if a separate spa pump 39 is present or is provided, the corresponding first actuators 31 and 32 of the manual stationary control 14 and the manual remote control 18 including the hand-held wireless remote control unit 19 may be employed for switching the filter pump 33 and heater 34 for the spa on and off through the electrical controls 13, and the corresponding second actuators 36 and 37 may be employed for operating the separate spa pump 39 through the electrical controls including the multiplexer or other apparatus 41 more fully described below.

The pump 33 is of a type having a filter 42 is series therewith and with the heater 34. The electric controls 13 for the spa pump 39 may serve to increase the operating speed of the filter pump 33 in a conventional manner, if no separate spa pump is present. The control line 43 for the spa pump 39 may then lead to the filter pump 33 to control the energization thereof, such as through a control relay (not shown) increasing pump speed in a conventional manner.

However, a separate spa pump 39 is preferably used for the desired water jet action in the spa. Other accessories, such as an air blower or bubbler 45 may also be used and remotely controlled.

In that case, the manual control 14 and the remote control 18 or the corresponding second actuators 36 and 37 thereof, may be employed for effecting a spa pump operation and a spa blower operation.

The illustrated embodiment of the invention provides the manual remote control 18 including its hand-held wireless remote control unit 19 with a first wireless channel 47 for the first actuator 32 and with a second wireless channel 48 for the second actuator 37 of that manual remote control including the hand-held wireless remote control unit 19. The wireless or radio frequency control signals 26 may thus proceed over two wireless or radio frequency channels. Three or more channels may be used within the scope of the invention.

If the spa 12 has a swimming pool 16 associated therewith, it may share the filter pump 33 and heater with that swimming pool through diverter valves 51 and 52. These valves may have solenoids or other electrical actuators 53 and 54, respectively, associated therewith, as part as an extension of the electric controls 13. For that and other cases, the expression "switching on and off" as applied to the pool filter 33, heater 34, etc., is intended to be broad enough to cover also a switching of such components from pool to spa, and from spa to pool.

The manual stationary control 14 and said manual remote control 18 including its hand-held wireless remote control unit 19 are provided with corresponding first actuators 31 and 32 for switching the filter pump 33 and heater 34 through diverter valves 51 and 52 between the swimming pool 16 and the spa 12, and with corresponding second actuators 36 and 37 for effecting a spa pump operation, such as by activating the spa pump 39 or by augmenting the energization or activity of the filter pump 33, such as in the manner disclosed above or otherwise.

The control effected with actuators 31 and 32 preferably is of the alternate mode type; that is, the filter pump 33 and heater 34 assembly are switched on or from pool 16 to spa 12 when the actuator 31 or 32 is first depressed and stay there, until either actuator 31 or 32 is again depressed, at which time the filter pump-heater train 32-34 is switched off or back from spa to pool.

Initial depression of either actuator 31 or 32 also turns on the filter pump 33 for the spa 12, if it was not already running at that time for the pool 16.

Initial actuation of either actuator 31 or 32 also increases the setting of the heater 34 to the higher spa setting, such as via a heater control line 56.

The drawing shows a simple control wherein a solenoid or stepping relay 61 is energized through the first stationary actuator 31 or through the first remote control actuator 32 and channel 1 to step a cam 62 by half a turn. This enables a cam protrusion 63 to close contactors 64, 65, 66 and 67 to energize the diverter valve controls 53 and 54, the filter pump 33, and the spa setting heater line 56, respectively. The installation thus is switched to and remains in the spa mode, until either first switch 31 or 32 is again depressed, in which case the relay or actuator 61 rotates the cam 62 by another half turn, whereby the cam protrusion 63 leaves the contactor actuation 69, thereby reopening the contactor and reverting the installation to a pool mode.

Conversely, the control effected by corresponding second actuators or switches 36 and 37 preferably is of a pulse mode type wherein various spa or pool accessories, such as a pool, spa, or landscaping lamp or lighting 71, the spa pump 39 or other spa pump action, and the air blower or spa bubbler 45 are cycled as either switch 36 or 37 is depressed in pulsed succession individually or interchangeably.

In principle, each of the components 39, 45 and 71 could be individually turned on and off. A stepping relay may be used at 41 for this purpose. However, the drawing shows a multiplexer 41 which turns on the light 71 when either switch 36 and 37 is first depressed and which then turns on the spa pump 39 without turning off the light when either switch 36 or 37 is thereafter depressed. Similarly, when either switch 36 and 37 is thereafter depressed, the multiplexer 41 turns on the blower 45, preferably without at that time turning off the light 71 and the spa pump 39.

Finally, when either switch 36 or 37 is again depressed, the multiplexer 41 turns off the light 71, spa pump 39 and blower 45.

What so far has been characterized as a multiplexer may, indeed, be an electronic multiplexer. However, the drawing shows a selector at 41 actuated by a stepping relay 90 driving four ganged contactor discs 91, 92, 93 and 94 one quarter of a turn each time the stationary manual actuator or switch 36 is depressed or the corresponding remote manual actuator or switch 37 is depressed.

After receipt of the first pulse from the stationary actuator 36 or from the remote actuator 37 via channel 2, the stepping relay 90 turns the contactor discs 91 to 94 jointly by one quarter turn, thereby energizing the indicator or signal lamp 78 and the illumination 71 via contact segments 95 and 96, respectively. To avoid crowding, no input is shown for the contact segments. However, it is, of course, understood that energizing current is applied to those segments, such as through a common shaft at 99, for instance.

After receipt of the second pulse from actuator 36 or 37, the relay 90 steps all contactor discs by a further quarter turn, thereby energizing the spa pump 39 or a spa pump function through contact segment 97.

After receipt of the third pulse from either of the actuators 36 and 37, the stepping relay 90 advances the discs 91 to 94 by a third quarter turn, thereby energizing the blower 45 through a fourth contact segment 98. Relays may, of course, be used between the segment output contacts and the apparatus they are energizing.

All spa accessories may be turned off by interchangeably actuating either of the stationary and remote actuators 36 and 37 for a fourth time. In that case, the relay 90 steps the selector discs 91-94 a fourth quarter turn back to their position shown in the drawing. This also deenergizes the fourth indicator, such as by turning off the signal lamp 78.

The components 23 or other visual indicators are very useful in practice and according to a further aspect of the invention, may be used independently of one or more features disclosed above.

In either case, there may be a first indicator or indicator light 73 indicating to the user or spa occupier that the heater 34 is on, both in the pool heating mode and in the spa heating mode. In this respect, the pool heater may be controlled by a timer 74, which may be overridden by the control 13.

A second indicator or signal lamp 75 would indicate that the heater 34 is in the lower temperature pool heating mode. This is useful from an energy conservation point of view, since it might prompt the pool owner or user to avoid unnecessary long-term or daily heating. A conventional pool heat switch (not shown) may be used at the control 25 for disabling the pool heat mode when unnecessary.

On the other hand, a third indicator or signal lamp 76 confirms to the user that he or she has set the spa heating mode, which provides higher water temperature, by depressing either switch or push button 31 or 32. In the illustrated embodiment, this tells the user that his or her attempt to switch to the spa mode has been effective. The signal lamp 75 goes off at the same time.

If the user again depresses either switch 31 or 32, the signal lamp 76 goes off thereby confirming that he or she has switched the equipment back to the pool mode. The signal lamp 75 may then go on again, if pool heating is enabled. The user thus will always know what he or she is doing. This is especially important in the case of use of the remote control at 19, when the user is in the spa away from, but not out of view of, the control center 25. The same applies to actuation of the second switches 36 and 37. In particular, the indicator or signal light 78 indicates when either of the second switches 36 and 37 has been first depressed. That indicator 78 stays on when the spa pump 39 or other spa pump operation has been activated through depression of either one of the second switches 36 and 37.

That indicator 78 also stays on when the operation of the blower 45 has been added by further depression or actuation of either the stationary actuator 36 or its remote equivalent 37.

Thereafter, extinguishment of the last of the second indicators, in this case the indicator 78, signifies to the user that Channel 2 has been completely cycled ready for initiation of the next cycle through actuation of either second switch 36 or 37.

Similarly, when either of the first switches 31 and 32 is depressed for a second time, extinguishment of the last of the first indicators, in this case of the indicator light 76, indicates to the user that he or she has switched the equipment off or back to swimming pool mode operation at 51 and 52, and that the higher heater setting at 56 has been terminated, while the separate spa pump 39 or an alternative spa pump setting at the filter pump 33 has been terminated as well.

As mentioned above, such signaling feature would still be useful within the scope of the subject invention, even if there were no corresponding parallel control at 31 and 36. In that case, the indicators or signal lamps within the array 23 would still serve the user at the remote control unit 19 in or at the spa 12 as a remote signalling facility, aiding his or her proper actuation of the remote control unit. This is much better than relying for such a purpose just on the lighting 71 which is not a signal lamp, but a spa or pool light or illumination.

In practice, the pool may also be equipped with an automatic pool cleaner 81, served by a valve 82 actuated by a solenoid or control 83. The timer 74 may also be used to actuate the pool cleaner 81 periodically. However, as indicated by the dotted line 84, the pool cleaner 81 may be a pool accessory that is also actuated by the controls 14 and/or 19, as may other pool and spa accessories (not shown).

It may be noted that the preferred embodiment of the invention provides truly interchangeably stationary and manual controls at 14 and 19 which the spa and pool user may use pretty much like a light switch at one end of a hallway and a corresponding light switch for the same lamp at the other end of that hallway. For instance, the user may first push the actuator 31 to switch the installation to spa mode, such as disclosed above. Especially at night, the user may then depress the second manual actuator 36 to turn on the spa and pool lighting 71. The user may then proceed to the spa and depress the second actuator 37 of the remote control unit 19, which will turn on the spa pump, since the selector disk 93 has already been advanced by a quarter turn previously when the user depressed the manual actuator 36 in our example. The user may then again depress the second remote actuator 37 to actuate the blower 45 for bubble action while in the spa. All this time, visible indicators or signal lights 23 will aprise the user of the progress and efficiency of the control operation.

Upon returning to the house or cabana, the user can switch off all pool accessories by again depressing the stationary actuator 36 and can even switch the installation back to pool mode by depressing also the first stationary actuator 31.

However, while providing these conveniences, the illustrated preferred embodiment of the invention does not limit the user to any such control sequence. Rather, the user at any time may initiate the spa operation from the remote control and still have the liberty to terminate it remotely from 19 or stationarily from 14. In the meantime, the user also has the liberty to activate any accessory interchangeably from either the stationary actuator 36 or from the remote actuator 37 without being limited thereby to use the same actuator for turning on any other one or more of the spa accessories or for turning off that same or any other spa accessory for that matter. All this is accomplished according to the illustrated preferred embodiment of the invention without requiring the user to remember and to actuate any override switches in any control panel.

The subject extensive disclosure will render apparent or suggest to those skilled in the art various modifications and variations within the spirit and scope of the subject invention and equivalents thereof.

We claim:

1. In a method of controlling equipment for operating a spa, the improvement comprising in combination the steps of:

providing electrical controls for controlling said equipment;

providing a manual stationary control for manual user operation of said electrical controls;

positioning said manual stationary control at a control location beyond manual reach from said spa;

providing a manual remote control including a hand-held wireless remote control unit for manual user operation, at least from inside said spa, of said electrical controls operable by said manual stationary control;

activating said manual stationary control for manual user operation of said equipment through said electrical controls manually from said control location;

activating said manual remote control for manual user operation of said equipment through said electrical controls with said hand-held wireless remote control unit at least from inside said spa; and maintaining said manual stationary control activated for continued manual user operation of said equipment through said electrical controls manually from said control location while said manual remote control remains activated for manual user operation of said equipment through said electrical controls interchangeably with said manual stationary control from said control location and with said hand-held wireless remote control unit at least from inside said spa.

2. A method as in claim 1, including the steps of: providing visual indicators for indicating to the user various conditions of said electrical controls and equipment as selected from time to time interchangeably with said remote control unit and with said manual stationary control.

3. A method as in claim 2, wherein: said visual indicators are positioned at said control location.

4. A method as in claim 3, including the steps of: providing a control center at said control location; and incorporating said manual stationary control, said visual indicators and part of said electrical controls in said control center.

5. A method as in claim 1, including the steps of: emitting wireless control signals with said hand-held wireless remote control unit for operation of said electric controls; providing said manual remote control with a wireless receiver for receiving said wireless control signals; and actuating said electrical controls with said received wireless control signals, while said manual stationary control remains interchangeably activated.

6. A method as in claim 5, including the step of: positioning said wireless receiver at said control location.

7. A method as in claim 5, including the steps of: providing visual indicators for indicating to the user various conditions of said electrical controls and equipment as selected from time to time interchangeably with said remote control unit and with said manual stationary control.

8. A method as in claim 1, including the step of: providing said manual stationary control and said manual remote control including said hand-held wireless remote control unit with corresponding first actuators for switching a filter pump and heater for said spa on and off through said electrical controls, and with corresponding second actuators for operating said filter pump at increased speed as a spa pump through said electrical controls.

9. A method as in claim 1, including the step of: providing said manual stationary control and said manual remote control including said hand-held wireless remote control unit with corresponding first actuators for switching a filter pump and heater for said spa on and off through said electrical controls, and with corresponding second actuators for operating a separate spa pump through said electrical controls.

10. A method as in claim 1, including the step of: providing said manual stationary control and said manual remote control including said hand-held wireless remote control unit with corresponding first actuators for switching a filter pump and heater for said spa on and off through said electrical controls, and with corresponding second actuators for effecting a spa pump operation and a spa blower operation.

11. A method as in claim 10, including the step of: providing said manual remote control including said hand-held wireless remote control unit with a first wireless channel for the first actuator and with a second wireless channel for the second actuator of said manual remote control including said hand-held wireless remote control unit.

12. A method as in claim 1, wherein: said spa has a swimming pool associated therewith and shares a filter pump and heater with that swimming pool through diverter valves; and said manual stationary control and said manual remote control including said hand-held wireless remote control unit are provided with corresponding first actuators for switching said filter pump and heater through said diverter valves between said swimming pool and said spa, and with corresponding second actuators for effecting a spa pump operation.

13. In a method of controlling equipment for operating a spa, the improvement comprising in combination the steps of:
providing electrical controls for controlling said equipment;
providing a manual stationary control for manual user operation of said electrical controls;
positioning said manual stationary control at a control location beyond manual reach from said spa;
providing a manual remote control including a hand-held wireless remote control unit for manual user operation, at least from inside said spa, of said electrical controls operable by said manual stationary control;
activating said manual stationary control for manual user operation of said equipment through said electrical controls manually from said control location;
activating said manual remote control for manual user operation of said equipment through said electrical controls with said hand-held wireless remote control unit at least from inside said spa; and
providing visual indicators for indicating to the user various conditions of said electrical controls and equipment as selected from time to time interchangeably with said remote control unit and with said manual stationary control.

14. A method as in claim 13, wherein: said visual indicators are positioned at said control location.

15. A method as in claim 14, including the steps of: providing a control center at said control location; and incorporating said manual stationary control, said visual indicators and part of said electrical controls in said control center.

16. A method as in claim 13, including the steps of: emitting wireless control signals with said hand-held wireless remote control unit for operation of said electric controls; providing said manual remote control with a wireless receiver for receiving said wireless control signals; and actuating said electrical controls with said received wireless control signals.

17. A method as in claim 16, including the step of: positioning said wireless receiver at said control location.

18. A method as in claim 16, including the steps of: providing visual indicators visible at least from said spa for indicating to the user various conditions of said electrical controls and equipment as selected from time to time with said remote control unit and with said manual stationary control.

19. A method as in claim 13, including the step of: providing said manual remote control including said hand-held wireless remote control unit with a first wireless channel for controlling a filter pump and heater for said spa, and with a second wireless channel for controlling a spa pump operation through said electrical controls.

20. A method as in claim 13, wherein: said spa has a swimming pool associated therewith and shares a filter pump and heater with that swimming pool through diverter valves; and said manual stationary control and said manual remote control including said hand-held wireless remote control unit are provided with corresponding first actuators for switching said filter pump and heater through said diverter valves between said swimming pool and said spa, and with corresponding second actuators for effecting a spa pump operation.

21. In apparatus for controlling equipment for operating a spa,
the improvement comprising in combination:
electrical controls for controlling said equipment;
a manual stationary control for said electrical controls;
a manual remote control for said electrical controls, including a hand-held wireless remote control unit;
means for activating said manual stationary control for manual user operation of said equipment through said electrical controls manually from a control location;
means for activating said manual remote control for manual user operation of said equipment through said electrical controls with said hand-held wireless remote control unit at least from inside said spa; and
means for maintaining said manual stationary control activated for continued manual user operation of said equipment through said electrical controls manually from said control location while said manual remote control remains activated for manual user operation of said equipment through said electrical controls interchangeably with said manual stationary control from said control location and with said hand-held wireless remote control unit at least from inside said spa.

22. Apparatus as in claim 21, including: visual indicators connected to said electrical controls for indicating to the user various conditions of said electrical controls and equipment as selected from time to time interchangeably with said remote control unit and with said manual stationary control.

23. Apparatus as in claim 22, including: means for positioning said visual indicators at said control location.

24. Apparatus as in claim 22, including: a control center at said control location incorporating said manual stationary control, said visual indicators and part of said electrical controls.

25. Apparatus as in claim 21, wherein: said hand-held wireless remote control unit includes means for emitting wireless control signals for operation of said electric controls; and said manual remote control includes a wireless receiver for said wireless control signals for actuation of said electrical controls, while said manual stationary control remains interchangeably activated.

26. Apparatus as in claim 25, including: means for positioning said wireless receiver at said control location.

27. Apparatus as in claim 25, including; visual indicators connected to said electrical controls for indicating to the user various conditions of said electrical controls and equipment as selected from time to time interchangeably with said remote control unit and with said manual stationary control.

28. Apparatus as in claim 21, wherein: said equipment includes a filter pump and heater; and said manual stationary control and said manual remote control including said hand-held wireless remote control unit have corresponding first actuators for switching said filter pump and heater for said spa on and off through said electrical controls, and corresponding second actuators for operating said filter pump at increased speed as a spa pump through said electrical controls.

29. Apparatus as in claim 21, wherein: said equipment includes a filter pump and heater, and a spa pump; and said manual stationary control and said manual remote control including said hand-held wireless remote control unit have corresponding first actuators for switching said filter pump and heater for said spa on and off through said electrical controls, and with corresponding second actuators for operating said spa pump through said electrical controls.

30. Apparatus as in claim 21, wherein: said equipment includes means for effecting a filter pump, spa pump, spa heater and spa blower operation; and said manual stationary control and said manual remote control including said hand-held wireless remote control unit have corresponding first actuators for controlling said filter pump and heater operation through said electrical controls, and corresponding second actuators for controlling a spa pump operation with and without spa blower operation.

31. Apparatus as in claim 30, wherein: said manual remote control including said hand-held wireless remote control unit has a first wireless channel for the first actuator and a second wireless channel for the second actuator of said manual remote control including said hand-held wireless remote control unit.

32. Apparatus as in claim 21, wherein: said spa has a swimming pool associated therewith and shares a filter pump and heater with that swimming pool through diverter valves; and said manual stationary control and said manual remote control including said hand-held wireless remote control unit have corresponding first actuators for switching said filter pump and heater through said diverter valves between said swimming pool and said spa, and corresponding second actuators for effecting a spa pump operation.

33. In apparatus for controlling equipment for operating a spa,
the improvement comprising in combination:
providing electrical controls for controlling said equipment;

a manual stationary control for said electrical controls;

a manual remote control for said electrical controls, including a hand-held wireless remote control unit;

means for activating said manual stationary control for manual user operation of said equipment through said electrical controls manually from a control location;

means for activating said manual remote control for manual user operation of said equipment through said electrical controls with said hand-held, wireless remote control unit at least from inside said spa; and visual indicators connected to said electrical controls for indicating to the user various conditions of said electrical controls and equipment as selected from time to time interchangeably with said remote control unit and with said manual stationary control.

34. Apparatus as in claim 33, including:

means for positioning said visual indicators at said control location.

35. Apparatus as in claim 33, including:

a control center at said control location incorporating said manual stationary control, said visual indicators and part of said electrical controls.

36. A method as in claim 33, wherein:

said hand-held wireless remote control unit includes means for emitting wireless control signals for operation of said electric controls; and said manual remote control includes a wireless receiver for said wireless control signals for actuation of said electrical controls.

37. Apparatus as in claim 36, including:

means for positioning said wireless receiver at said control location.

38. Apparatus as in claim 36, including:

visual indicators connected to said electrical controls for indicating to the user various conditions of said electrical controls and equipment as selected from time to time interchangeably with said remote control unit and with said manual stationary control.

39. Apparatus as in claim 33, wherein:

said equipment includes means for effecting a filter pump, spa pump, spa heater and spa blower operation; and said manual remote control including said hand-held wireless remote control unit has a first wireless channel for controlling said filter pump and heater operation through said electrical controls and a second wireless channel for controlling said spa pump operation with and without spa blower operation.

40. Apparatus as in claim 33, wherein:

said spa has a swimming pool associated therewith and shares a filter pump and heater with that swimming pool through diverter valves; and said manual stationary control and said manual remote control including said hand-held wireless remote control unit have actuators for switching said filter pump and heater through said diverter valves between said swimming pool and said spa, and actuators for effecting a spa pump operation.

* * * * *